United States Patent
Ou et al.

(10) Patent No.: US 12,402,435 B1
(45) Date of Patent: Aug. 26, 2025

(54) SURFACE COMPOSITE FILM STRUCTURE WITH LONGITUDINAL TRANSMISSION CUTOFF AND TRANSVERSE TRANSMISSION CONDUCTION, AND PREPARATION METHOD AND APPLICATION THEREOF

(71) Applicant: Teranergy Technology Co., Ltd., Ningbo (CN)

(72) Inventors: Yali Ou, Ningbo (CN); Yuheng Zeng, Ningbo (CN); Jichun Ye, Ningbo (CN); Zunke Liu, Ningbo (CN); Hongkai Zhou, Ningbo (CN); Mingdun Liao, Ningbo (CN); Wei Liu, Ningbo (CN)

(73) Assignee: TERANERGY TECHNOLOGY CO., LTD., Ningbo (CN)

( * ) Notice: Subject to any disclaimer, the term of this patent is extended or adjusted under 35 U.S.C. 154(b) by 0 days.

(21) Appl. No.: 19/185,307

(22) Filed: Apr. 22, 2025

Related U.S. Application Data

(63) Continuation of application No. PCT/CN2024/136319, filed on Dec. 3, 2024.

(30) Foreign Application Priority Data

Jan. 23, 2024 (CN) .......................... 202410089054.3

(51) Int. Cl.
*H10F 77/30* (2025.01)
*H10F 71/00* (2025.01)

(52) U.S. Cl.
CPC ......... *H10F 77/311* (2025.01); *H10F 71/129* (2025.01)

(58) Field of Classification Search
None
See application file for complete search history.

(56) References Cited

U.S. PATENT DOCUMENTS

| | | |
|---|---|---|
| 2013/0280546 A1 | 10/2013 | Elam et al. |
| 2023/0083659 A1 | 3/2023 | Wu et al. |

FOREIGN PATENT DOCUMENTS

| | | |
|---|---|---|
| CN | 112954888 A | 6/2021 |
| CN | 118136696 A | 6/2024 |
| JP | 2015142025 A | 8/2015 |

*Primary Examiner* — Eli S Mekhlin
(74) *Attorney, Agent, or Firm* — Bayramoglu Law Offices LLC

(57) ABSTRACT

A surface composite film structure with longitudinal transmission cutoff and transverse transmission conduction, and a preparation method and application thereof are provided. The surface composite film structure includes a nano dielectric layer arranged on a surface of a silicon substrate, a silicide layer arranged on the nano dielectric layer and a polycrystalline silicon layer arranged on the silicide layer. A material of the nano dielectric layer is a hydrogenated silicon oxide film, a material of the silicide layer is a hydrogenated carbon nitride silicon film including phosphorus or boron, and a material of the polycrystalline silicon layer is a phosphorus-doped or boron-doped polycrystalline silicon film. The surface composite film structure can achieve an excellent passivation effect and has the characteristics of longitudinal non-conduction and transverse conduction, and the transverse sheet resistance is flexibly adjustable, meeting the performance requirements of new silicon-based semiconductor physical devices.

20 Claims, 2 Drawing Sheets

SURFACE COMPOSITE FILM STRUCTURE WITH LONGITUDINAL TRANSMISSION CUTOFF AND TRANSVERSE TRANSMISSION CONDUCTION, AND PREPARATION METHOD AND APPLICATION THEREOF

CROSS REFERENCE TO THE RELATED APPLICATIONS

This application is a continuation application of International Application No. PCT/CN2024/136319, filed on Dec. 3, 2024, which is based upon and claims priority to Chinese Patent Application No. 202410089054.3, filed on Jan. 23, 2024, the entire contents of which are incorporated herein by reference.

TECHNICAL FIELD

The present invention relates to the technical field of surface composite film structure of silicon-based semiconductor device, and particularly to a surface composite film structure with longitudinal transmission cutoff and transverse transmission conduction, and a preparation method and application thereof.

BACKGROUND

Excellent controllable surface passivation and surface carrier transport are key factors in improving the performance of a silicon semiconductor physical device. For silicon semiconductor devices, the requirements for their surfaces are diverse, and different silicon semiconductor physical devices have different requirements for surface composite film structures. Taking solar cells as an example, some cell structures, such as all back contact solar cells, only need to achieve excellent front surface passivation and optical transmittance characteristics at the same time; some cell structures, such as back contact solar cells, need to achieve excellent front surface passivation, longitudinal and transverse carrier transport, and optical transmittance characteristics at the same time.

So far, the most commonly used surface composite film structures include two categories: one is the surface passivation structure, and the other is the surface passivating contact structure. The surface passivation structure achieves good passivation of the silicon surface through a passivation film, reducing recombination, which is manifested by obtaining a lower horizontal saturation current density ($J_0$). The saturation current density is a physical quantity used to describe the magnitude of the surface recombination effect. The smaller the value, the weaker the surface recombination effect. However, the main problem of this structure is that the surface of the device cannot realize the longitudinal or transverse transmission of carriers, which is manifested by almost infinite contact resistivity ($\rho_c$) and sheet resistance ($R_{sq}$). Contact resistivity characterizes an ability of carriers to transmit in the longitudinal direction, and sheet resistance characterizes an ability of carriers to transmit in the transverse direction. The surface passivating contact structure achieves good passivation and carrier transmission on the silicon surface through passivating contact technology, which can reduce recombination, which is manifested by obtaining a lower level of $J_0$. This structure can usually also realize longitudinal and transverse transmission of carriers on the surface, showing device application-level $\rho_c$ (0.0001-0.1 $\Omega \cdot cm^2$) and $R_{sq}$ (10-1000 $\Omega$/sq).

However, so far, there is no structure that can achieve excellent passivation, longitudinal non-conduction, and good transverse transmission on the surface, which limits the development of a plurality of new silicon-based semiconductor devices with special applications, such as silicon-based optoelectronic device with new optoelectronic coupling characteristics.

SUMMARY

The purpose of the present invention is to develop a surface composite film structure that can achieve excellent passivation, longitudinal non-conduction, and good transverse transmission on the surface of a silicon wafer to meet the needs of a new silicon-based semiconductor physical device.

To achieve the above purpose, a first aspect of the present invention provides a surface composite film structure with longitudinal transmission cutoff and transverse transmission conduction, including a nano dielectric layer arranged on a surface of a silicon substrate, a silicide layer arranged on the nano dielectric layer and a polycrystalline silicon layer arranged on the silicide layer, where a material of the nano dielectric layer is a hydrogenated silicon oxide film, a material of the silicide layer is a hydrogenated carbon nitride silicon film including phosphorus or boron, and a material of the polycrystalline silicon layer is a phosphorus-doped or boron-doped polycrystalline silicon film.

The surface composite film structure of the present invention can achieve excellent passivation effect and has the characteristics of longitudinal non-conduction and transverse conduction, and the transverse sheet resistance is flexibly adjustable, meeting the performance requirements of new silicon-based semiconductor physical device.

Further, a refractive index of the silicide layer is 1.5-3.0, and a transmittance of the silicide layer above 400 nm is greater than 97%. The refractive index of the silicide layer can be controlled by adjusting the composition, and it has extremely low optical absorption characteristics.

Further, a carbon concentration of the silicide layer is $1 \times 10^{21}$ $cm^{-3}$-$2 \times 10^{22}$ $cm^{-3}$, and a nitrogen concentration of the silicide layer is $5 \times 10^{21}$ $cm^{-3}$-$4 \times 10^{22}$ $cm^{-3}$.

Further, a phosphorus/boron concentration of the silicide layer is $1 \times 10^{19}$ $cm^{-3}$-$1 \times 10^{21}$ $cm^{-3}$. The phosphorus/boron concentration of the silicide layer is adjustable, thereby achieving control of the transmission performance of the surface composite film structure.

Further, a thickness of the nano dielectric layer is 1-20 nm, and a thickness of the silicide layer is greater than 10 nm. The surface composite film structure can achieve controllable adjustment of optical absorption and transmission characteristics by adjusting parameters such as the refractive index and film thickness of the silicide layer and the polycrystalline silicon layer.

Further, a hydrogen concentration of the nano dielectric layer is $1 \times 10^{19}$ $cm^{-3}$-$1 \times 10^{22}$ $cm^{-3}$, and a hydrogen concentration of the silicide layer is $1 \times 10^{19}$ $cm^{-3}$-$1 \times 10^{22}$ $cm^{-3}$. Each layer of the surface composite film structure has a high hydrogen concentration and good chemical stability and can achieve excellent surface protection for the silicon wafer.

Further, the material of the polycrystalline silicon layer is the phosphorus-doped polycrystalline silicon film with an activation concentration range of $1 \times 10^{19}$ $cm^{-3}$-$1 \times 10^{21}$ $cm^{-3}$, or the material of the polycrystalline silicon layer is the boron-doped polycrystalline silicon film with an activation concentration range of $5 \times 10^{18}$ $cm^{-3}$-$5 \times 10^{20}$ $cm^{-3}$. The sheet resistance of the composite film can be adjusted by adjusting a doping concentration of the polycrystalline silicon layer.

Further, the silicon substrate comprises hydrogen element, carbon element and nitrogen element, a concentration of each element gradually decreases from the surface to a body; the surface of the silicon substrate includes a hydrogen concentration of $1\times10^{19}$ cm$^{-3}$-$1\times10^{21}$ cm$^{-3}$, a nitrogen concentration of $1\times10^{19}$ cm$^{-3}$-$1\times10^{22}$ cm$^{-3}$, and a carbon concentration of $1\times10^{19}$ cm$^{-3}$-$1\times10^{22}$ cm$^{-3}$. Carbon and nitrogen atoms can effectively capture hydrogen atoms and inject them into the substrate and interface to passivate more defect states; introducing elements such as carbon and nitrogen into the near surface of silicon wafer can improve the mechanical performance of silicon wafer.

Further, a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and hydrogenated silicon oxide film. Adding the hydrogen-rich dielectric layer can improve the passivation performance of the surface composite film structure.

A second aspect of the present invention provides a preparation method of the above-mentioned surface composite film structure with longitudinal transmission cutoff and transverse transmission conduction, including the following steps:

S1, cleaning the silicon substrate;
S2, preparing a silicon oxide film on the surface of the silicon substrate;
S3, depositing an amorphous silicon film comprising carbon and nitrogen elements;
S4, depositing an amorphous silicon film doped with phosphorus or boron;
S5, performing a high-temperature annealing treatment to diffuse the carbon and nitrogen elements into the silicon substrate and transforming the amorphous silicon film doped with the phosphorus or the boron into a polycrystalline silicon film; and
S6, performing a hydrogenation treatment.

The preparation method of the surface composite film structure of the present invention is fully compatible with the prior battery production line technology and has good mass production application prospects. The surface composite film structure has good thermal stability, and its passivation quality is not affected by temperature within a temperature range not higher than 500 C.°.

Further, between the steps S2 and S3, the preparation method includes a step of depositing one or a laminated film of more selected from aluminum oxide, silicon nitride, silicon oxide and silicon nitride oxide.

A third aspect of the present invention provides a silicon-based semiconductor device, including the above-mentioned surface composite film structure with longitudinal transmission cutoff and transverse transmission conduction. The surface composite film structure has excellent surface passivation effect and has the characteristics of longitudinal non-conduction and transverse conduction, which is beneficial to improving the performance of silicon-based semiconductor device.

In summary, the present invention has the following beneficial effects compared with the prior art:

(1) The surface composite film structure of the present invention has the characteristics of longitudinal transmission cutoff and transverse transmission conduction, and the transverse sheet resistance is flexibly adjustable, which can meet the performance requirements of new silicon-based semiconductor device.

(2) The surface composite film structure of the present invention does not use transparent conductive oxides (TCO) film material at all, avoiding the negative effects of some common high-quality TCOs, such as indium tin oxide (ITO) uses rare metal indium (In), aluminum-doped zinc oxide (AZO) absorbs water and is unstable, and tantalum doped tin oxide (TTO) has significant parasitic absorption; at the same time, the preparation method does not require the use of magnetron sputtering equipment.

(2) The refractive index and film thickness of the silicide layer and polycrystalline silicon layer of the surface composite film structure of the present invention are adjustable, so that the optical absorption and transmission characteristics can be controlled and adjusted.

(3) The surface composite film structure of the present invention has excellent surface passivation effect and body passivation effect, which can reduce the saturation current density on the surface of the silicon wafer and improve the body life.

(4) The components of the surface composite film structure of the present invention include silicon, nitrogen, carbon and other elements, which have good chemical stability and thermal stability, can achieve excellent surface protection for silicon wafer, and its passivation quality is not affected by temperature within a temperature range below 500° C.

(5) The surface composite film structure of the present invention can introduce elements such as carbon and nitrogen into the near surface of the silicon wafer, which is beneficial to improving the mechanical performance of the silicon wafer.

(6) The preparation method of the surface composite film structure of the present invention is fully compatible with prior preparation technology, has no ion bombardment damage, has low material cost, and has good industrial application prospects.

Figure 1:
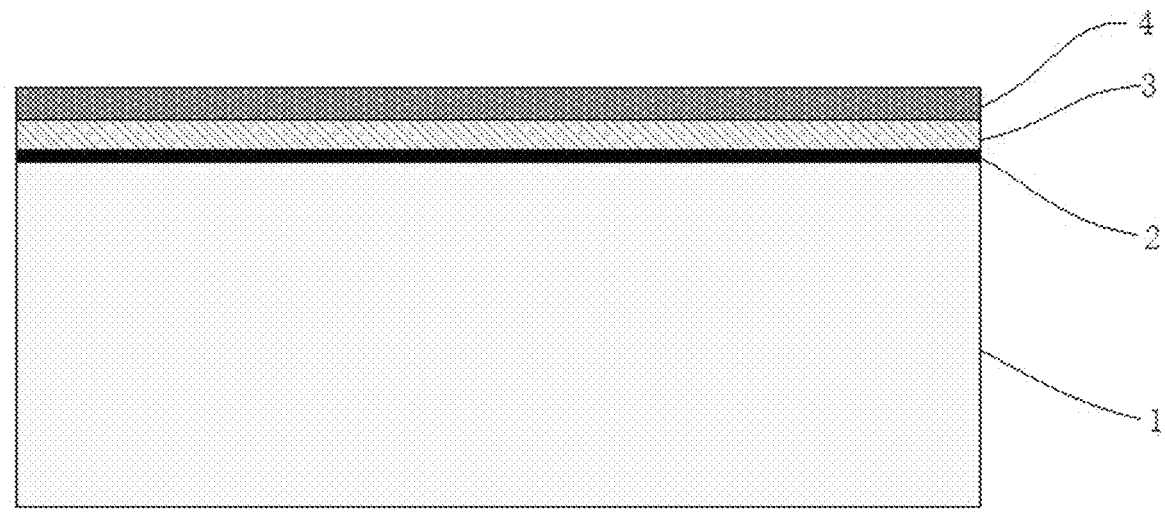
FIG. 1 is a schematic diagram showing the structure of the surface composite film structure in a specific embodiment of the present invention.

Explanation of reference numbers in the drawings:
1—silicon substrate, 2—nano dielectric layer, 3—silicide layer, 4—polycrystalline silicon layer, 5—hydrogen-rich dielectric layer.

DETAILED DESCRIPTION OF THE EMBODIMENTS

In order to make the above-mentioned features and advantages of the present invention more obvious and easier to understand, the specific embodiments of the present invention are described in detail below in conjunction with the drawings. It should be noted that the following embodiments are only used to illustrate the implementation method and typical parameters of the present invention, and are not used to limit the parameter range described in the present invention. Reasonable changes derived therefrom are still within the scope of protection of the claims of the present invention.

It should be noted that the endpoints and any values of the ranges disclosed in the present article are not limited to the precise ranges or values, and these ranges or values should be understood to include values close to these ranges or values. For the numerical range, the endpoint values of each range, the endpoint values of each range and the individual point values, and the individual point values can be combined with each other to obtain one or more new numerical ranges, which should be regarded as specifically disclosed in the present article.

The specific embodiment of the present invention provides a surface composite film structure, which includes the characteristics of longitudinal transmission cutoff and transverse transmission conduction. The typical structure of the surface composite film structure is shown in FIG. 1, including the nano dielectric layer 2, the silicide layer 3 and the polycrystalline silicon layer 4 stacked on the surface of the silicon substrate 1 in sequence.

The material of the nano dielectric layer 2 is a hydrogenated silicon oxide film, the main components of which are silicon, oxygen and hydrogen. The hydrogen concentration in the nano dielectric layer 2 is $>1\times10^{19}$ cm$^{-3}$, and the typical hydrogen concentration range is $1\times10^{19}$ cm$^{-3}$-$1\times10^{22}$ cm$^{-3}$. Its thickness is above 1 nm, the typical thickness range is 1-20 nm, and the preferred thickness is 1-2 nm. The transmittance of the nano dielectric layer 2 above 400 nm is greater than 97%, and the absorption coefficient k value decreases to nearly 0 at a wavelength above 400 nm, and the nano dielectric layer 2 has extremely low optical absorption characteristics.

The material of the silicide layer 3 is a hydrogenated carbon nitride silicon film including phosphorus or boron, and the main components are silicon, nitrogen, carbon, hydrogen, and phosphorus or boron; the silicide layer 3 can also include oxygen elements. Its thickness is above 10 nm. The transmittance of the silicide layer 3 above 400 nm is greater than 97%, and the absorption coefficient k value decreases to nearly 0 at a wavelength above 400 nm, and the silicide layer 3 has extremely low optical absorption characteristics. The carbon concentration of the silicide layer is $1\times10^{21}$ cm$^{-3}$-$2\times10^{22}$ cm$^{-3}$, the nitrogen concentration of the silicide layer is $5\times10^{21}$ cm$^{-3}$-$4\times10^{22}$ cm$^{-3}$, the ratio of carbon, nitrogen and other elements in the silicide layer 3 can be adjusted, and the range of its refractive index is 1.5-3.0, which can be adjusted according to the composition. The boron/phosphorus concentration in the silicide layer 3 is adjustable, and the typical concentration range is $1\times10^{19}$ cm$^{-3}$-$1\times10^{21}$ cm$^{-3}$. The hydrogen concentration in the silicide layer 3 is $>1\times10^{19}$ cm$^{-3}$, and the typical concentration range is $1\times10^{19}$ cm$^{-3}$-$1\times10^{22}$ cm$^{-3}$.

The material of the polycrystalline silicon layer 4 is a phosphorus-doped or boron-doped polycrystalline silicon film. The activation concentration range of the phosphorus-doped polycrystalline silicon film is usually $1\times10^{19}$-$1\times10^{21}$ cm$^{-3}$, and the activation concentration range of the boron-doped polycrystalline silicon film is $5\times10^{18}$ cm$^{-3}$-$5\times10^{20}$ cm$^{-3}$. The thickness of the polycrystalline silicon layer 4 is adjustable. By adjusting its thickness, the transmittance of the surface composite film structure can be changed.

The silicon substrate 1 includes hydrogen, nitrogen, carbon, and phosphorus or boron elements near the surface and in the body, and the concentration of the corresponding elements gradually decreases from the surface to the body. Among them, in the surface area below the nano dielectric layer 2, the nitrogen concentration is generally higher than $1\times10^{19}$ cm$^{-3}$, and the typical concentration range is $1\times10^{19}$ cm$^{-3}$-$1\times10^{22}$ cm$^{-3}$; the carbon concentration is generally higher than $1\times10^{19}$ cm$^{-3}$, and the typical concentration range is $1\times10^{19}$ cm$^{-3}$-$1\times10^{22}$ cm$^{-3}$; the hydrogen concentration is generally higher than $1\times10^{19}$ cm$^{-3}$, and the typical concentration range is $1\times10^{19}$ cm$^{-3}$-$1\times10^{21}$ cm$^{-3}$.

Figure 2:
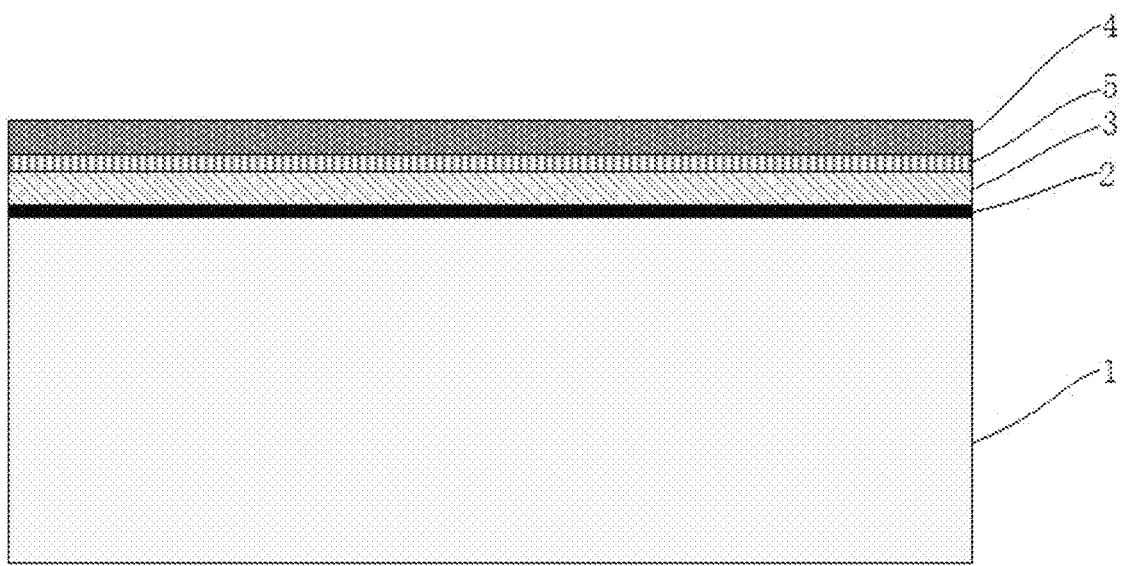
FIG. 2 is a schematic diagram showing the structure of another surface composite film structure in a specific embodiment of the present invention.

Combined with FIG. 2, another typical structure of the surface composite film structure is shown in FIG. 2, including the nano dielectric layer 2, the silicide layer 3, the hydrogen-rich dielectric layer 5 and the polycrystalline silicon layer 4 stacked on the surface of the silicon substrate 1 in sequence. The characteristics of the silicon substrate 1, the nano dielectric layer 2, the silicide layer 3, and the polycrystalline silicon layer 4 are the same as the surface composite film structure of the above-mentioned embodiment.

Among them, the material of the hydrogen-rich dielectric layer 4 is hydrogenated aluminum oxide, hydrogenated silicon nitride, hydrogenated silicon oxide, hydrogenated silicon nitride oxide or a combination of these laminated films. The range of the hydrogen concentration of the hydrogen-rich dielectric layer 4 is $1\times10^{20}$ cm$^{-3}$-$1\times10^{22}$ cm$^{-3}$. The hydrogen-rich dielectric layer may also include boron or phosphorus elements.

Figure 3:
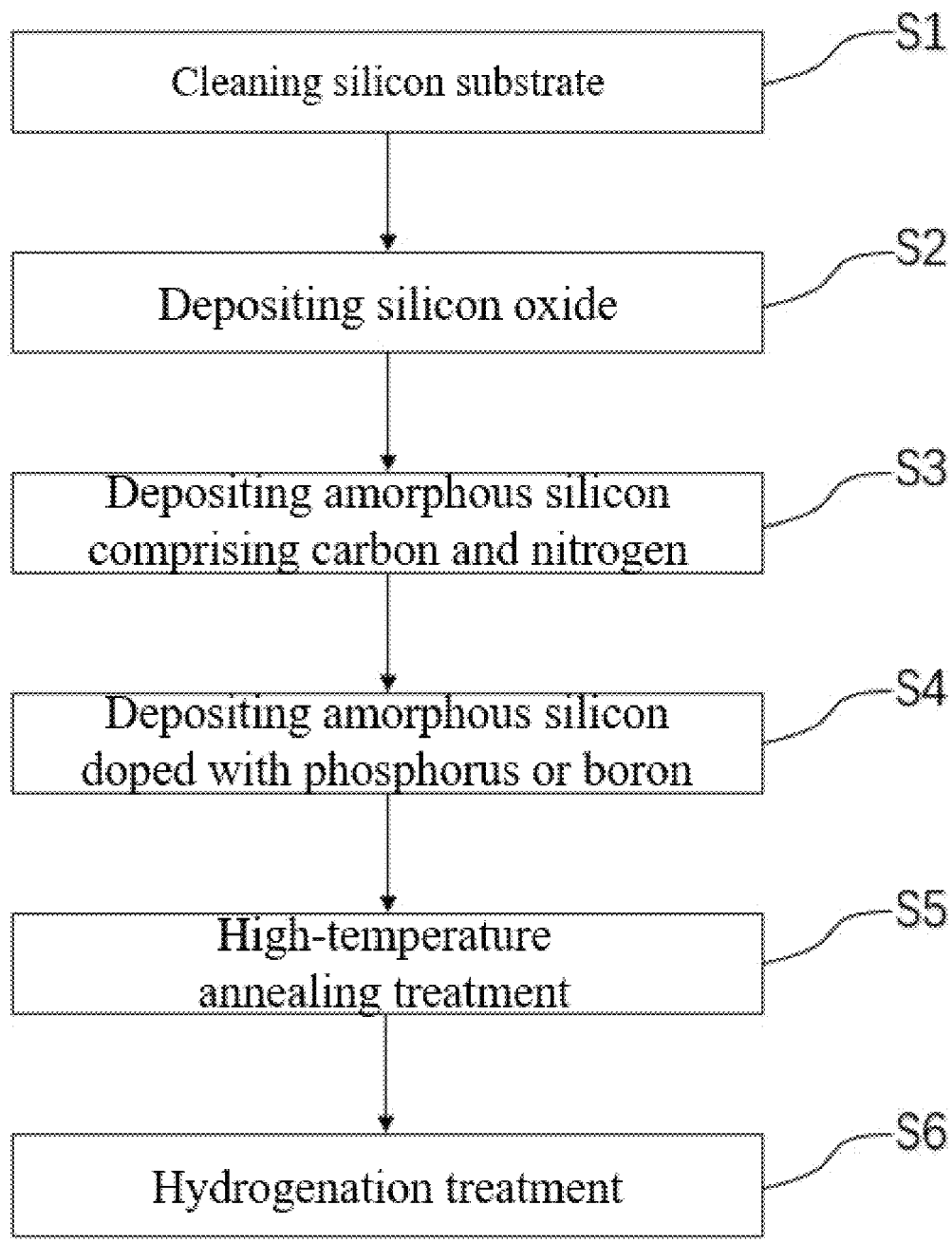
FIG. 3 is a process flow chart of the surface composite film structure in a specific embodiment of the present invention.

Combined with FIG. 3, the typical preparation method of the above-mentioned surface composite film structure includes the following steps:

S1, performing standard radio corporation of America (RCA) cleaning on the silicon substrate.

S2, preparing a silicon oxide film on the surface of the silicon substrate, where the preparation method includes wet chemical method, plasma assisted oxidation method, thermal oxidation method, ozone oxidation method, etc.

S3, depositing an amorphous silicon film including carbon and nitrogen elements on the silicon oxide film. The typical preparation method is plasma-enhanced chemical vapor deposition (PECVD) in-situ deposition method, and the range of the deposition temperature is 100 C.°-600 C.°.

S4, depositing an amorphous silicon film doped with phosphorus or boron on the amorphous silicon film; or first depositing a hydrogen-rich dielectric layer on the amorphous silicon film, and then depositing an amorphous silicon film doped with phosphorus or boron on the hydrogen-rich dielectric layer.

S5, performing high-temperature annealing to diffuse carbon and nitrogen elements into the silicon substrate and transforming the amorphous silicon film doped with phosphorus or boron into a polycrystalline silicon film. The typical temperature range is 600 C.°-1200 C.°, preferably 900-950 C.°.

S6, performing hydrogenation treatment. The hydrogenation treatment method includes: annealing or light annealing in hydrogen-containing atmosphere to achieve hydrogen injection; or depositing a hydrogen-rich dielectric film, followed by low-temperature annealing, and then cleaning and etching to remove the hydrogen-rich dielectric film.

The above-mentioned surface composite film structure has excellent surface passivation effect and has the characteristics of longitudinal non-conduction and transverse conduction, which is suitable for new silicon-based semiconductor device. Its preparation method is fully compatible with prior production line technology, has low preparation cost, high stability, and good industrial application prospects.

The technical solution and effect of the present invention are described below through specific examples.

Example 1

N-type silicon wafer is prepared, which is flat, with 110 μm thick, and with 1-7 Ω·cm resistivity. After standard RCA cleaning, the silicon wafer is placed in a PECVD chamber, N20 plasma is used to prepare $SiO_x$ film, then a 10 nm nitrogen-rich and carbon-rich amorphous silicon film (carbon concentration is $1 \times 10^{22}$ $cm^{-3}$, nitrogen concentration is $1 \times 10^{22}$ $cm^{-3}$) is deposited, and then a 30 nm phosphorus-doped amorphous silicon film is deposited; high temperature annealing is performed at 900 C.° in a tube furnace for 30 min; and finally, annealing is performed at 400 C.° for 60 min in nitrogen/hydrogen mixed gas atmosphere. Six samples are prepared to perform Sinton tests. The single-sided saturation current density $J_{0,s}$ test results range is 0.5-1 $fA/cm^2$, the transverse sheet resistance range is 1000-1600 Ω/sq, the longitudinal contact resistivity cannot be measured, and the transmittance at a wavelength of 400 nm is about 90%.

Example 2

N-type silicon wafer is prepared, which is flat, with 110 μm thick, and with 1-7 Ω·cm resistivity. After standard RCA cleaning, the silicon wafer is placed in a PECVD chamber, N20 plasma is used to prepare $SiO_x$ film, and then a 10 nm nitrogen-rich and carbon-rich amorphous silicon film (carbon concentration is $2 \times 10^{22}$ $cm^{-3}$, nitrogen concentration is $5 \times 10^{21}$ $cm^{-3}$) is deposited, and then a 200 nm phosphorus-doped amorphous silicon film is deposited; high temperature annealing is performed at 900 C.° in a tube furnace for 30 min; and finally, annealing is performed at 400 C.° for 60 min in nitrogen/hydrogen mixed gas atmosphere. Six samples are prepared to perform Sinton tests. The single-sided saturation current density $J_{0,s}$ test results range is 1.0-2.0 $fA/cm^2$, the transverse sheet resistance range is 20-40 22/sq, the longitudinal contact resistivity cannot be measured, and the transmittance at a wavelength of 400 nm is about 50%.

Example 3

N-type silicon wafer is prepared, which is flat, with 110 μm thick, and with 1-7 Ω·cm resistivity. After standard RCA cleaning, the silicon wafer is placed in a PECVD chamber, N20 plasma is used to prepare $SiO_x$ film, and then a 10 nm nitrogen-rich and carbon-rich amorphous silicon film (carbon concentration is $1 \times 10^{22}$ $cm^3$, nitrogen concentration is $1 \times 10^{22}$ $cm^{-3}$) is deposited; then atomic layer deposition (ALD) is used to deposit $AlO_x$, and then transferred to PECVD to deposit $SiN_x$; then a 30 nm phosphorus-doped amorphous silicon film is deposited; high temperature annealing is performed at 900 C.° in a tube furnace for 30 min; then ALD is used to deposit $AlO_x$, and then transferred to PECVD to deposit $SiN_x$ for hydrogenation treatment; and then $AlO_x/SiN_x$ is etched using hydrofluoric acid (HF) solution. Six samples are prepared to perform Sinton tests. The single-sided saturation current density $J_{0,s}$ test results range is 0.2-0.5 $fA/cm^2$, the transverse sheet resistance range is 1000-1600 Ω/sq, the longitudinal contact resistivity cannot be measured, and the transmittance at a wavelength of 400 nm is about 90%.

Example 4

N-type silicon wafer is prepared, which is flat, with 110 μm thick, and with 1-7 Ω·cm resistivity. After standard RCA cleaning, the silicon wafer is placed in a PECVD chamber, N20 plasma is used to prepare $SiO_x$ film, then a 10 nm nitrogen-rich and carbon-rich amorphous silicon film (carbon concentration is $1 \times 10^{21}$ $cm^{-3}$, nitrogen concentration is $3 \times 10^{22}$ $cm^{-3}$) is deposited, $SiN_x$ is deposited, and then 200 nm phosphorus-doped amorphous silicon film is deposited; high temperature annealing is performed at 900 C.° in a tube furnace for 30 min; then ALD is used to deposit $AlO_x$, and then transferred to PECVD to deposit $SiN_x$ for hydrogenation treatment; and $AlOx/SiN_x$ is subsequently etched using HF solution. Six samples are prepared to perform Sinton tests. The single-sided saturation current density $J_{0,s}$ test results range is 0.5-1.2 $fA/cm^2$, the transverse sheet resistance range is 20-40 Ω/sq, the longitudinal contact resistivity cannot be measured, and the transmittance at a wavelength of 400 nm is about 50%.

Comparative Example 1

N-type silicon wafer is prepared, which is flat, with 110 μm thick, and with 1-7 Ω·cm resistivity. After standard RCA cleaning, the silicon wafer is placed in ALD chamber; $AlO_x$ is deposited and then transferred to a tube furnace, and annealing is performed at 450 C.° for 30 min in nitrogen atmosphere. Six samples are prepared to perform Sinton tests, the single-sided saturation current density $J_{0,s}$ test results range is 3.0-5.0 $fA/cm^2$, and both longitudinal contact resistivity and transverse sheet resistance cannot be measured.

Comparative Example 2

N-type silicon wafer is prepared, which is flat, with 110 μm thick, and with resistivity 1-7 Ω·cm. After standard RCA cleaning, the silicon wafer is placed in ALD chamber; $AlO_x$ is deposited and then transferred to a tube furnace, annealing is performed at 450 C.° for 30 min in nitrogen atmosphere, and transferred to PECVD to deposit $SiN_x$, finally transferred to the tube furnace, and annealing is performed at 400 C.° for 60 min in nitrogen/hydrogen mixed gas. Six samples are prepared to perform Sinton tests. The single-sided saturation current density $J_{0,s}$ test results range is 2.0-4.0 $fA/cm^2$, and both the longitudinal contact resistivity and transverse sheet resistance cannot be measured.

Comparative Example 3

N-type silicon wafer is prepared, which is flat, with 110 μm thick, and with 1-7 Ω·cm resistivity. After standard RCA cleaning, the silicon wafer is placed in a tube furnace to prepare $SiO_x$ in oxygen atmosphere, and then transferred to a PECVD chamber to deposit $SiN_x$; and finally, annealing is performed at 400 C.° for 60 min in a tube furnace under a nitrogen/hydrogen mixed gas. Six samples are prepared to perform Sinton tests. The single-sided saturation current density $J_{0,s}$ test results range is 8.0-12.0 $fA/cm^2$, and both longitudinal contact resistivity and transverse sheet resistance cannot be measured.

Comparative Example 4

N-type silicon wafer is prepared, which is flat, with 110 μm thick, and with 1-7 Ω·cm resistivity. After standard RCA cleaning, the silicon wafer is placed in a tube furnace to prepare $SiO_x$ in oxygen atmosphere, and then transferred to a PECVD chamber to deposit $SiN_x$; annealing is performed at 400 C.° for 60 min under a nitrogen/hydrogen mixed gas; and then a layer of about 60 nm ITO film is deposited on the surface by magnetron sputtering. Six samples are prepared to perform Sinton tests. The single-sided saturation current density $J_{0,s}$ test results range is 20-40 fA/cm², the transverse sheet resistance range is 40-60 22/sq, and the longitudinal contact resistivity cannot be measured.

Comparative Example 5

N-type silicon wafer is prepared, which is flat, with 110 μm thick, and with 1-7 Ω·cm resistivity. After standard RCA cleaning, the silicon wafer is placed in a tube furnace to prepare $SiO_x$ in oxygen atmosphere, and then transferred to a PECVD chamber to deposit 120 nm of phosphorus-doped amorphous silicon; then annealing is performed at 900 C.° for 30 min in nitrogen/hydrogen mixed gas atmosphere in a tube furnace; and finally annealing is performed at 400 C.° for 60 min in nitrogen/hydrogen mixed gas atmosphere. Six samples are prepared to perform Sinton tests. The single-sided saturation current density $J_{0,s}$ test results range is 1.0-3.0 fA/cm², the transverse sheet resistance range is 30-50 £2/sq, and the longitudinal contact resistivity range is 0.001-0.003 Ωcm².

Comparative Example 6

N-type silicon wafer is prepared, which is flat, with 110 μm thick, and with 1-7 Ω·cm resistivity. After standard RCA cleaning, the silicon wafer is placed in a tube furnace to prepare $SiO_x$ in ozone atmosphere, and then transferred to a PECVD chamber to deposit 120 nm of phosphorus-doped amorphous silicon; then annealing is performed at 880 C.° for 30 min under nitrogen/hydrogen mixed gas atmosphere in a tube furnace; and finally annealing is performed at 400 C.° for 60 min under nitrogen/hydrogen mixed gas atmosphere. Six samples are prepared to perform Sinton tests. The single-sided saturation current density $J_{0,s}$ test results range is 6.0-10.0 fA/cm², the transverse sheet resistance range is 50-70 Ω/sq, and the longitudinal contact resistivity range is 0.002-0.004 Ωcm².

The single-sided saturation current density ($J_{0,s}$), transverse sheet resistance and longitudinal contact resistivity of the passivated sheets prepared in Examples 1~4 and Comparative Examples 1-6 are compared, and the results are shown in Table 1 below. The results show that the surface composite film structure of the present invention has an excellent passivation effect, which can greatly reduce the saturation current density on the surface of the silicon wafer and has the characteristics of longitudinal non-conduction and transverse conduction.

TABLE 1

Comparison of passivated sheet performance between Examples 1-4 and Comparative Examples 1-6

| Parameters | $J_{0,s}$ (fA/cm²) | $R_{sq}$ (Ω/sq) | $\rho_c$ (Ω·cm²) |
|---|---|---|---|
| Example 1 | 0.5-1.0 | 1000-1600 | ∞ |
| Example 2 | 1.0-2.0 | 20-40 | ∞ |
| Example 3 | 0.2-0.5 | 1000-1600 | ∞ |
| Example 4 | 0.5-1.2 | 20-40 | ∞ |
| Comparative Example 1 | 3.0-5.0 | ∞ | ∞ |
| Comparative Example 2 | 2.0-4.0 | ∞ | ∞ |
| Comparative Example 3 | 8.0-12.0 | ∞ | ∞ |
| Comparative Example 4 | 20.0-40.0 | 40-60 | ∞ |
| Comparative Example 5 | 1.0-3.0 | 30-50 | 0.001-0.003 |
| Comparative Example 6 | 6.0-10.0 | 50-70 | 0.002-0.004 |

Comparison of Passivated Sheet Performance Between Examples 1-4 and Comparative Examples 1-6

Although the present invention is disclosed as above, the present invention is not limited thereto. Any person skilled in the art can make various changes and modifications without departing from the spirit and scope of the present invention. Therefore, the protection scope of the present invention shall be subject to the scope defined by the claims.

What is claimed is:

1. A surface composite film structure with longitudinal transmission cutoff and transverse transmission conduction, comprising a nano dielectric layer arranged on a surface of a silicon substrate, a silicide layer arranged on the nano dielectric layer and a polycrystalline silicon layer arranged on the silicide layer, wherein a material of the nano dielectric layer is a hydrogenated silicon oxide film, a material of the silicide layer is a hydrogenated carbon nitride silicon film comprising phosphorus or boron, and a material of the polycrystalline silicon layer is a phosphorus-doped polycrystalline silicon film or a boron-doped polycrystalline silicon film.

2. The surface composite film structure according to claim 1, wherein a refractive index of the silicide layer is 1.5-3.0, and a transmittance of the silicide layer above 400 nm is greater than 97%.

3. The surface composite film structure according to claim 2, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

4. The surface composite film structure according to claim 1, wherein a carbon concentration of the silicide layer is $1\times10^{21}$ cm$^{-3}$-$2\times10^{22}$ cm$^{-3}$, and a nitrogen concentration of the silicide layer is $5\times10^{21}$ cm$^{-3}$-$4\times10^{22}$ cm$^{-3}$.

5. The surface composite film structure according to claim 4, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

6. The surface composite film structure according to claim 1, wherein a phosphorus or boron concentration of the silicide layer is $1\times10^{19}$ cm$^{-3}$-$1\times10^{21}$ cm$^{-3}$.

7. The surface composite film structure according to claim 6, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

8. The surface composite film structure according to claim 1, wherein a thickness of the nano dielectric layer is 1-20 nm, and a thickness of the silicide layer is greater than 10 nm.

9. The surface composite film structure according to claim 8, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

10. The surface composite film structure according to claim 1, wherein a hydrogen concentration of the nano dielectric layer is $1\times10^{19}$ cm$^{-3}$-$1\times10^{22}$ cm$^{-3}$, and a hydrogen concentration of the silicide layer is $1\times10^{19}$ cm$^{-3}$-$1\times10^{22}$ cm$^{-3}$.

11. The surface composite film structure according to claim 10, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

12. The surface composite film structure according to claim 1, wherein the material of the polycrystalline silicon layer is the phosphorus-doped polycrystalline silicon film with an activation concentration range of $1\times10^{19}$ cm$^{-3}$-$1\times10^{21}$ cm$^{-3}$, or the material of the polycrystalline silicon layer is the boron-doped polycrystalline silicon film with an activation concentration range of $5\times10^{18}$ cm$^{-3}$-$5\times10^{20}$ cm$^{-3}$.

13. The surface composite film structure according to claim 12, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

14. The surface composite film structure according to claim 1, wherein the silicon substrate comprises hydrogen element, carbon element and nitrogen element, and a concentration of each element of the hydrogen element, the carbon element and the nitrogen element gradually decreases from the surface of the silicon substrate to a body of the silicon substrate; and the surface of the silicon substrate comprises a hydrogen concentration of $1\times10^{19}$ cm$^{-3}$-$1\times10^{21}$ cm$^{-3}$, a nitrogen concentration of $1\times10^{19}$ cm$^{-3}$-$1\times10^{22}$ cm$^{-3}$, and a carbon concentration of $1\times10^{19}$ cm$^{-3}$-$1\times10^{22}$ cm$^{-3}$.

15. The surface composite film structure according to claim 14, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

16. The surface composite film structure according to claim 1, wherein a hydrogen-rich dielectric layer is provided between the silicide layer and the polycrystalline silicon layer, and a material of the hydrogen-rich dielectric layer is one or a laminated film of more selected from hydrogenated aluminum oxide film, hydrogenated silicon nitride film, hydrogenated silicon nitride oxide film and the hydrogenated silicon oxide film.

17. A preparation method of the surface composite film structure according to claim 1, comprising the following steps:
 S1, cleaning the silicon substrate;
 S2, preparing a silicon oxide film on the surface of the silicon substrate;
 S3, depositing an amorphous silicon film comprising carbon element and nitrogen element;
 S4, depositing an amorphous silicon film doped with the phosphorus or the boron;
 S5, performing a high-temperature annealing treatment to diffuse the carbon element and the nitrogen element into the silicon substrate and transforming the amorphous silicon film doped with the phosphorus or the boron into a polycrystalline silicon film; and
 S6, performing a hydrogenation treatment.

18. The preparation method according to claim 17, wherein between the step S2 and the step S3, the preparation method comprises a step of depositing one or a laminated film of more selected from aluminum oxide, silicon nitride, silicon oxide and silicon nitride oxide.

19. The preparation method according to claim 17, wherein in the surface composite film structure, a refractive index of the silicide layer is 1.5-3.0, and a transmittance of the silicide layer above 400 nm is greater than 97%.

20. A silicon-based semiconductor device, comprising the surface composite film structure according to claim 1.

\* \* \* \* \*